United States Patent [19]
Walczak et al.

[11] Patent Number: 5,193,223
[45] Date of Patent: Mar. 9, 1993

[54] POWER CONTROL CIRCUITRY FOR A TDMA RADIO FREQUENCY TRANSMITTER

[75] Inventors: Thomas J. Walczak, Woodstock; Stephen V. Cahill, Palatine, both of Ill.

[73] Assignee: Motorola, Inc., Schaumburg, Ill.

[21] Appl. No.: 920,178

[22] Filed: Jul. 27, 1992

Related U.S. Application Data

[63] Continuation of Ser. No. 632,231, Dec. 20, 1990, abandoned.

[51] Int. Cl.$^5$ .............................................. H03C 1/62
[52] U.S. Cl. ................................ 455/115; 455/116; 455/126; 455/127; 379/59
[58] Field of Search ...................... 455/116, 115, 67.1, 455/33.1, 54.1, 126, 127, 234.1, 234.2, 240.1, 241.1, 245.2, 253.2; 379/59

[56] References Cited

U.S. PATENT DOCUMENTS

| | | | |
|---|---|---|---|
| 4,523,155 | 6/1985 | Walczak et al. | 330/279 |
| 4,602,218 | 7/1986 | Vilmur et al. | 300/279 |
| 4,636,741 | 1/1987 | Mitzlaff | 330/127 |
| 4,757,502 | 7/1988 | Meuriche | 370/104 |
| 4,803,440 | 2/1989 | Hotta et al. | 330/145 |
| 4,870,698 | 9/1989 | Katsuyama | 455/67 |
| 5,086,508 | 2/1992 | Furuno | 455/69 |
| 5,095,542 | 3/1992 | Suematsu et al. | 455/127 |

Primary Examiner—Reinhard J. Eisenzopf
Assistant Examiner—Almaz Woldu
Attorney, Agent, or Firm—Rolland R. Hackbart

[57] ABSTRACT

A TDMA cellular telephone (600) includes in its transmit signal path, microphone (608), vocoder (612), data format circuitry (601), quadrature modulator (602), 90 MHz local oscillator (606), transmitter with mixer (604), transmitter filter (618), and antenna (620). In its receive signal path, the TDMA cellular telephone (600) includes receiver filter (622) coupled to antenna (620), quadrature demodulator (624), and data deformat circuitry (625). The channel frequency of TDMA cellular telephone (600) is loaded into synthesizer (616) by microcomputer (614) and applied to transmitter (604) and demodulator (624). TDMA cellular telephone (600) is controlled by microcomputer (614) which includes a memory with a control and signaling computer program stored therein. Transmitter (604) includes novel power control circuitry (100) comprised of variable gain stage (104), mixer (106), bandpass filter (109), and directional coupler (112) in a forward path, and detector (116), A/D converter (118), digital controller (120), and D/A converter (126) in a feedback path.

30 Claims, 4 Drawing Sheets

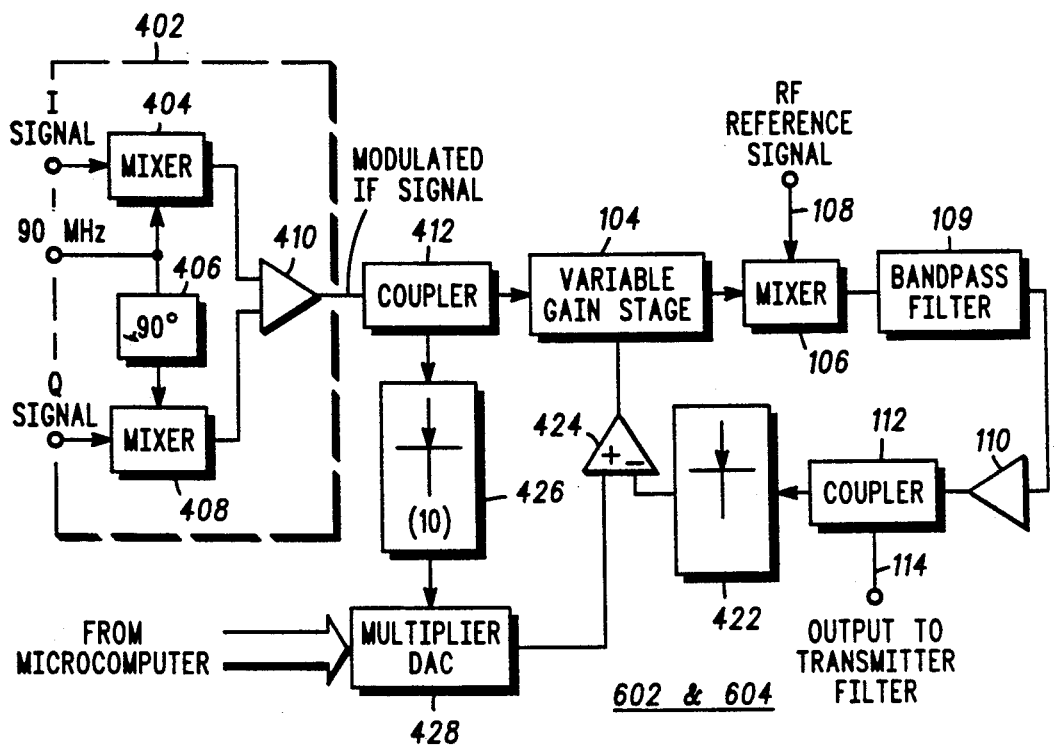
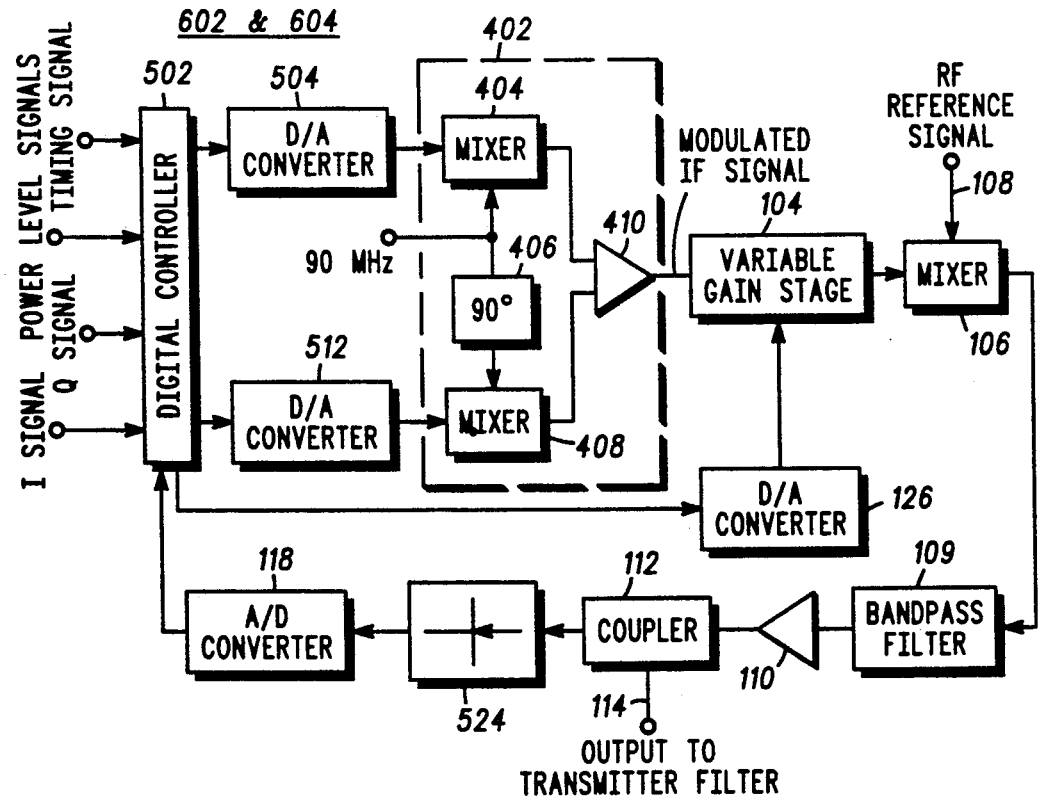
FIG.4
FIG.5

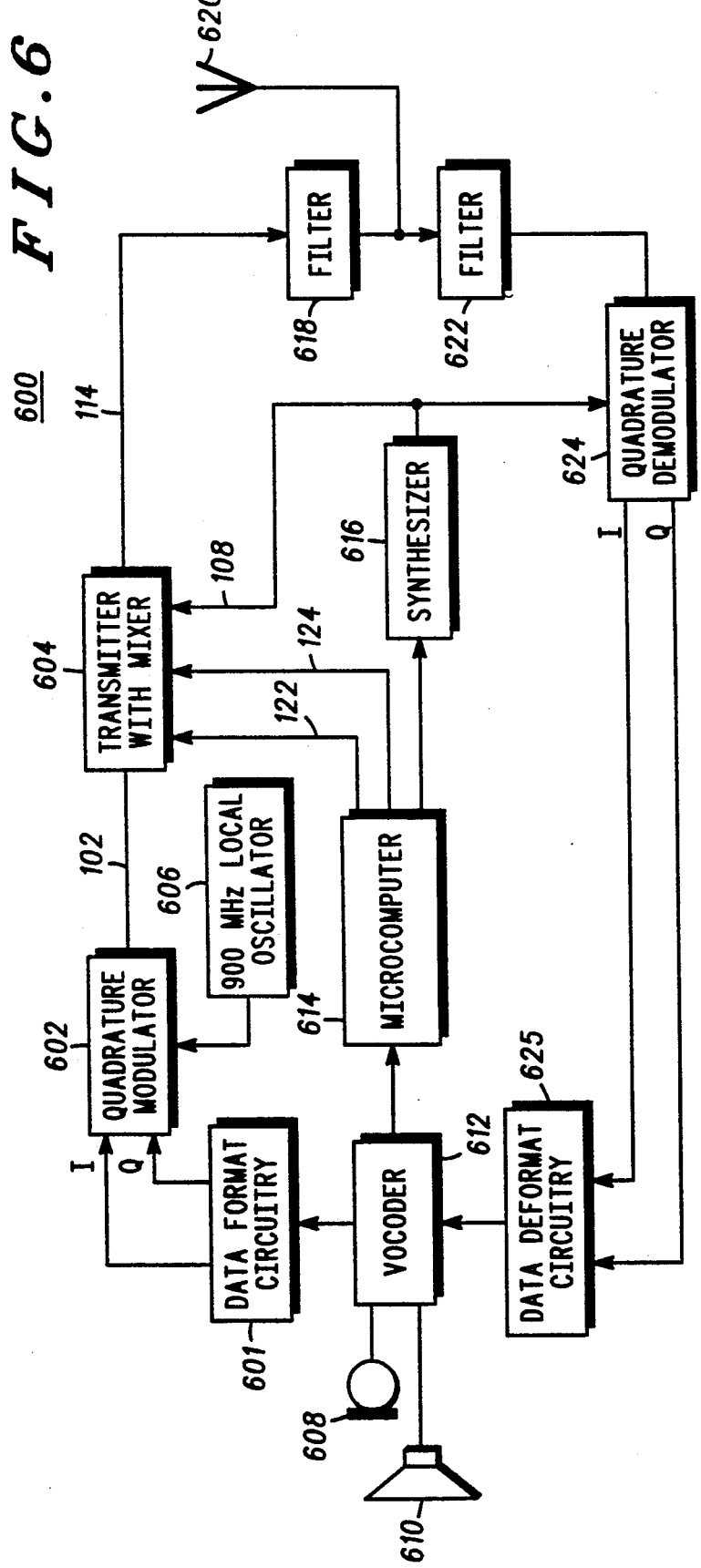

POWER CONTROL CIRCUITRY FOR A TDMA RADIO FREQUENCY TRANSMITTER

This is a continuation of application Ser. No. 07/632,231, filed Dec. 20, 1990 and now abandoned.

BACKGROUND OF THE INVENTION

The present invention is generally related to radiotelephones, and more particularly to power control circuitry for a time-division multiple-access (TDMA) radio frequency (RF) transmitter that may be advantageously used in digital cellular telephones.

Analog cellular telephones currently are continuously transmitting during a telephone call. RF transmitters of such analog cellular telephones are frequency modulated with voice signals and continuously operated at one of eight different power levels depending the quality of the RF signal received therefrom by the cellular system base station. The output power of such RF transmitters are maintained at the desired power level by conventional automatic output power control circuitry, such as, for example, the circuitry shown and described in U.S. Pat. No. 4,523,155. However, such conventional output power control circuitry is inadequate for TDMA cellular systems where it is necessary to rapidly pulse the RF transmitter on for 6.67 milliseconds and off 13.33 milliseconds every 20 milliseconds. Furthermore, it is also necessary that the RF transmitter output follow the envelope of the modulation, which has frequency components in excess of 12.15 KHz. These problems may be solved in part by output power control circuitry employing variable attenuators which attenuate the RF input to the transmitter power amplifier. An example of such output power control circuitry employing a variable attenuator is shown and described in U.S. Pat. No. 4,803,440. However, when such output power control circuitry employing a variable attenuator is operated at cellular transmitter frequencies ranging from 824 MHz to 849 MHz, substantial degradation in performance occurs due to feedthru, temperature stability, manufacturing variations, and poor linearity of the variable attenuator. For the foregoing reasons, there is a need for improved power control circuitry for precisely and reliably maintaining the maintaining RF output signal from a TDMA RF signal transmitter at one of a plurality of power levels selected by the level control signals.

SUMMARY OF THE INVENTION

Briefly stated, the present invention encompasses novel power control circuitry responsive to level control signals and a transmit intermediate frequency (IF) signal from a signal source for maintaining the magnitude of a radio frequency (RF) output signal at one of a plurality of power levels selected by the level control signals. The power control circuitry comprises: reference circuitry for generating an RF reference signal; adjusting circuitry having variable gain for adjusting the transmit IF signal substantially in proportion to the value of a gain control signal to produce an adjusted transmit IF signal; mixing circuitry for combining the adjusted transmit IF signal and the RF reference signal to produce an RF transmit signal; amplifying circuitry for amplifying the RF transmit signal to produce the RF output signal; detecting circuitry coupled to the RF output signal for generating a detector output signal having a value related to the magnitude of the RF output signal; and control circuitry coupled to the detector output signal for, at a plurality of intervals, sampling the value of the detector output signal, and adjusting the value of the gain control signal in response to the difference between the sampled value of the detector output signal and a desired value selected by the level control signals.

BRIEF DESCRIPTION OF THE DRAWINGS

FIG. 4 is an alternative embodiment of power control circuitry for an RF transmitter, embodying the present invention.

FIG. 5 is another alternative embodiment of power control circuitry for an RF transmitter, embodying the present invention.

FIG. 6 is a block diagram of a TDMA cellular telephone, which may advantageously utilize the power control circuitry of the present invention, as embodied preferably in FIG. 1 and alternatively in FIG. 4 or FIG. 5.

FIG. 7 is a circuit diagram of long time constant detector 116 in FIG. 1.

DESCRIPTION OF THE PREFERRED EMBODIMENT

Figure 1:
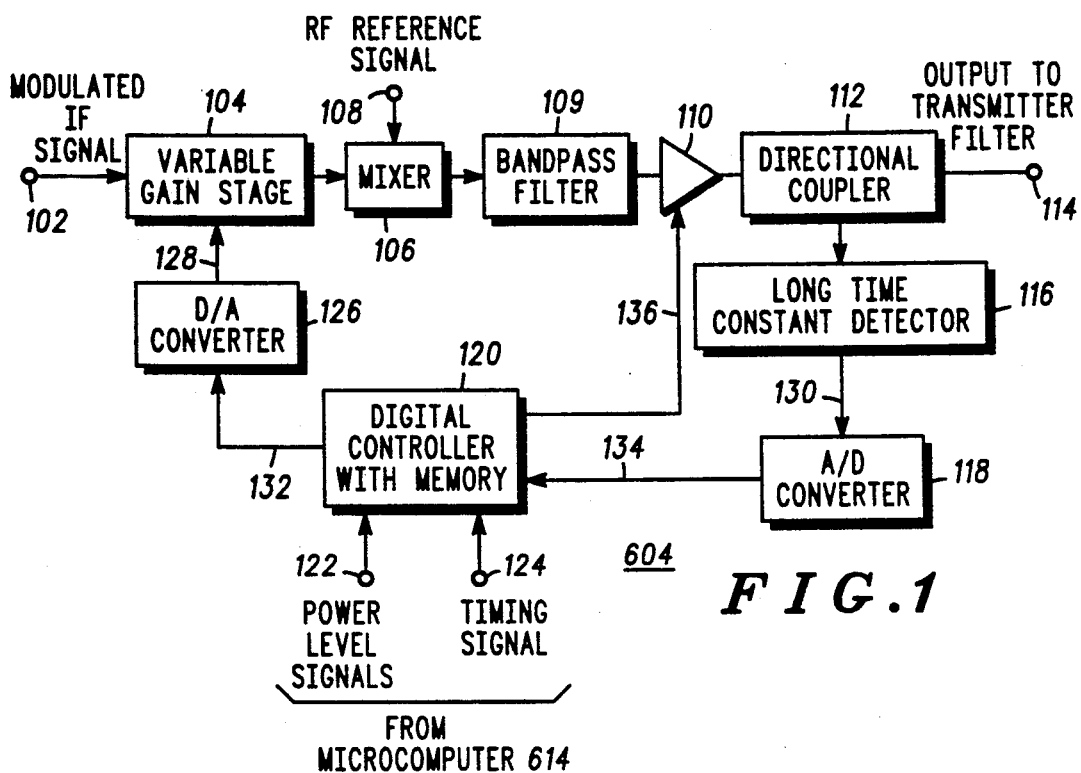
FIG. 1 is a block diagram of power control circuitry for an RF transmitter of TDMA cellular telephone 600 in FIG. 6, embodying the present invention.

Referring to FIG. 6, there is illustrated a block diagram of a TDMA cellular telephone 600, which may advantageously utilize the power control circuitry of the present invention, as embodied preferably in FIG. 1 and alternatively in FIG. 4 or FIG. 5. TDMA cellular telephone 600 includes, in its transmit signal path, microphone 608, vocoder 612, data format circuitry 601, quadrature modulator 602, 90 MHz local oscillator 606, transmitter with mixer 604, transmitter filter 618, and antenna 620. In its receive signal path, TDMA cellular telephone 600 includes antenna 620, receiver filter 622, quadrature demodulator 624, and data deformat circuitry 625. The channel frequency of TDMA cellular telephone 600 is loaded into synthesizer 616 by microcomputer 614 and applied to transmitter 604 and demodulator 624. In the preferred embodiment, the duplex radio channels have transmit frequencies in the range from 824 MHz to 849 MHz and receive frequencies in the range from 869 MHz to 894 MHz. TDMA cellular telephone 600 is controlled by microcomputer 614 which includes a memory with a control and signaling computer program stored therein. In the preferred embodiment of TDMA cellular telephone 600, microcomputer 614 is implemented with commercially available microcomputers, such as, for example, the Motorola type 68HC11 microcomputer. Although cellular telephone 600 utilizes TDMA RF channels, the present invention may also be utilized in conventional frequency division multiple access cellular telephones, in code division multiple access cellular telephones, and in other analog and digital cellular telephones employing different transmission schemes.

In the preferred embodiment of TDMA cellular telephone 600 in FIG. 6, quadrature modulator 602 is implemented as described in the instant assignee's copending patent application no. 07/526,156, (now U.S. Pat.

No. 5,020,076 granted May 28, 1991) entitled "Hybrid Modulation Apparatus", invented by Stephen V. Cahill et al., and filed May 21, 1990 (incorporated herein by reference) now U.S. Pat. No. 5,020,076. Quadrature modulator 602 modulates TDMA RF signals with voice, data and signalling information according to π/4-shift differential quadrature phase shift keying (DQPSK). DQPSK modulation is described in "Digital Communications", by John G. Proakis, 1st Ed., ISBN 0-07-050927-1, at pages 171-178. Data format circuitry 601 combines the output of vocoder 612 with signalling and overhead information and encodes the result according to π/4-shift DQPSK modulation into the transmit I and Q signals. The π/4-shift DQPSK modulation and signalling information is specified in Interim Standard 54 published by and available from the Electronic Industries Association, Engineering Department, 2001 Eye Street N.W., Washington, D.C. 20006.

The signal vector representing the π/4-shift DQPSK modulation consists of a cosine component and a sine component. The signal scaling the amplitude of the cosine component is also known as the in-phase or I signal and the signal scaling the amplitude of the sine component is also known as the quadrature or Q signal. The I and Q scaled cosine and sine signals are the orthogonal quadrature components at the frequency of the 90 MHz signal from local oscillator 606; the modulated transmit IF signal 102 then being created by adding the I and Q signals.

Symbols representing the vector components of the I and Q signals are generated in data format circuitry 601 by shifting the vector components such that phase shifts of IF signal 102 of $\pm\pi/4$ or $\pm 3\pi/4$ radians are generated. Each phase shift encodes one of four possible symbols.

Serial digital data from vocoder 612 that is eventually to be modulated by modulator 602 is first converted to bit pairs in data format circuitry 601. Each bit pair specifies a symbol that is the desired vector shift relative to the previously transmitted symbol. The mapping of bit pairs to symbol vectors is according to the equations:

$$I(k) = I(k-1)\cos(\Delta\phi(X(k),Y(k))) - Q(k-1)\sin(\Delta\phi(X(k),Y(k)))$$

$$Q(k) = I(k-1)\sin(\Delta\phi(X(k),Y(k))) + Q(k-1)\cos(\Delta\phi(X(k),Y(k)))$$

where k is an index of the bit pairs; k=1 for bits one and two paired, k=2 for bits three and four paired, etc. I(k−1) and Q(k−1) are the amplitudes of the cosine and sine components of the previous symbol vector. X(k) represents the first bit of bit pair (k) and Y(k) represents the second bit of bit pair (k). The phase change, Δφ, is determined according to the following table:

| X(k) | Y(k) | (Δφ(X(k), Y(k)) |
|---|---|---|
| 1 | 1 | −3π/4 |
| 0 | 1 | 3π/4 |
| 0 | 0 | π/4 |
| 1 | 0 | −π/4 |

Thus, one of four possible symbols are transmitted for each two bits of the serial data stream.

The reason for the modulation nomenclature π/4-shift DQPSK and how it works is now evident: the phase shift is in π/4 increments in vector space, symbols are differentially encoded with respect to the previous symbol vector, and the information bearing quantity in IF signal 102 is the phase-shift with one of four possible shifts between any two symbols. The operation of modulator 602 is represented by the equation:

$$V_{out}(t) = (I(t))\cos(2\pi ft) + (Q(t))\sin(2\pi ft)$$

where $V_{out}(t)$ is the modulated IF signal 102 and I(t) and Q(t) are I(k) and Q(k) as defined above as a function of time, and f is the transmit IF of 90 MHz.

In the preferred embodiment of TDMA cellular telephone 600 in FIG. 6, quadrature demodulator 624 is implemented as described in the instant assignee's co-pending patent application Ser. No. 07/590,401, entitled "A Carrier Recovery Method and Apparatus Having an Adjustable Response Time Determined by Carrier Signal Parameters", invented by Stephen V. Cahill, and filed Sep. 28, 1990 (incorporated herein by reference). Quadrature demodulator 624 demodulates TDMA RF signals modulated with information according to π/4-shift DQPSK and generates the receive I and Q signals. The receive I and Q signals are deformated and decoded by data deformat circuitry 625 to recover the digitized voice signals, which are applied to vocoder 612.

In the preferred embodiment of TDMA cellular telephone 600 in FIG. 6, vocoder 612 is implemented as described in the instant assignee's U.S. Pat. Nos. 4,817,157 and 4,896,361 (incorporated herein by reference). Vocoder 612 encodes and decodes voice signals according to code excited linear prediction (CELP) coding. Filters 618 and 622 are intercoupled as a duplexer for transmitting TDMA RF signals on, and receiving TDMA RF signals from antenna 620. Filters 618 and 622 may be any suitable conventional filters, such as, for example, the filters described in U.S. Pat. Nos. 4,431,977, 4,692,726, 4,716,391, and 4,742,562 (incorporated herein by reference). Vocoder 612, data format circuitry 601, data deformat circuitry 625, quadrature modulator 602, and quadrature demodulator 624 may be implemented with commercially available digital signal processors, such as, for example, the Motorola type DSP 56000 digital signal processor.

According to the present invention, power control circuitry of transmitter 604 in FIG. 6 is preferably implemented as illustrated in FIG. 1 and may be alternatively implemented as illustrated in FIG. 4 or FIG. 5. Although utilized in TDMA cellular telephones 600, the power control circuitry of the present invention may also be utilized in conventional frequency division multiple access cellular telephones, in code division multiple access cellular telephones, and in other analog and digital cellular telephones employing different transmission schemes. Referring now to FIG. 1, the power control circuitry includes variable gain stage 104, mixer 106, bandpass filter 109, and directional coupler 112 in a forward path, and detector 116, analog-to digital (A/D) converter 118, digital controller 120 and digital-to analog (D/A) converter 126 in a feedback path. Transmit IF signal 102 from quadrature modulator 602 has a frequency of 90 MHz and is modulated with DQPSK information. Stage 104 has a variable gain for adjusting the magnitude of IF signal 102 in response to D/A converter output signal 128. Stage 104 may be implemented by means of a variable gain amplifier or a variable gain attenuator, where the gain is adjusted substantially in proportion to the value of gain control signal 128. In the preferred embodiment, stage 104 is a variable gain amplifier similar to the Motorola type MC1350 IF amplifier. The adjusted IF signal from stage 104 is mixed with the RF reference signal 108 from synthesizer 616 to produce the RF transmit signal. The RF transmit signal is filtered by bandpass filter 109 and amplified by RF amplifier 110 to produce the RF transmit output signal 114. The transmit output signal 114 is coupled by directional coupler 112 to transmit filter 618 and thereafter antenna 620 for transmission.

Figure 2:
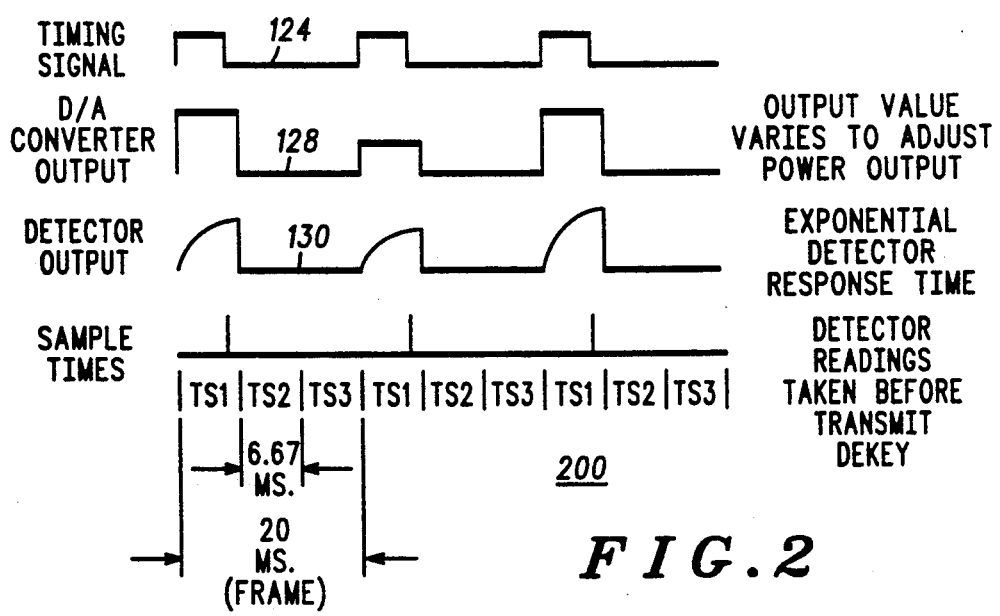
FIG. 2 is a timing diagram for the power control circuitry in FIG. 1.

The operation of the power control circuitry in FIG. 1 is further illustrated by the timing diagram in FIG. 2. Timing signal 124 has a waveform defining a series of transmit intervals, which in FIG. 2 correspond to time slot TS1 of three possible time slots TS1, TS2, and TS3 for a TDMA RF channel. The TDMA RF channel consists of multiple frames of 20 milliseconds each containing three time slots TS1, TS2, and TS3 of approximately 6.67 milliseconds each. During a cellular telephone call in a TDMA cellular system, TDMA cellular telephone 600 is assigned to a TDMA RF channel and a time slot of that channel for transmission of the modulated transmit output signal 114 carrying voice signals, signalling information and overhead information. Accordingly, it is necessary that the transmit output signal 114 be transmitted at the desired power level selected by the power level signals 122 during each of the assigned time slots.

According to a feature of the present invention, D/A converter 126 is loaded by controller 120 at the beginning of each assigned time slot with the value stored in its memory and at the end of each assigned time slot with a zero value for essentially turning the transmit output signal 114 on and off. In addition, amplifier 110 may also be turned on and off by gating its bias on and off by way of bias control signal 136. The D/A converter output 128 in FIG. 2 has a value which varies from time slot to time slot to maintain the output power of transmit output signal 114 at the desired power level. The waveform of detector output 130 in FIG. 2 has an exponential response due to the relatively long time constant of detector 116 with respect to the time slot length. Due to the relatively long time constant of detector 116, the output of detector 116 near the end of the time slot has a value related to the average magnitude of the transmit output signal 114. Detector 116, as shown in FIG. 7, includes rectifying circuitry comprised of diode 702 and capacitor 704, and averaging circuitry comprised of capacitors 704 and 708 and resistor 706. In the preferred embodiment, averaging circuitry 704, 706 and 708 has a time constant of approximately one millisecond.

Near the end of each time slot as illustrated by the sample times in FIG. 2, the value of the detector output 130 is sampled and used by controller 120 to compute a new value of D/A converter output 128 by subtracting the sampled value of the detector output 130 from the desired value for the selected power level, scaling the difference by a pre-selected factor, and summing the scaled difference with the previous value stored in memory. The new value of D/A converter output 128 is stored by controller 120 in its memory and loaded into D/A converter 126 at the beginning of the next assigned time slot.

Figure 3:
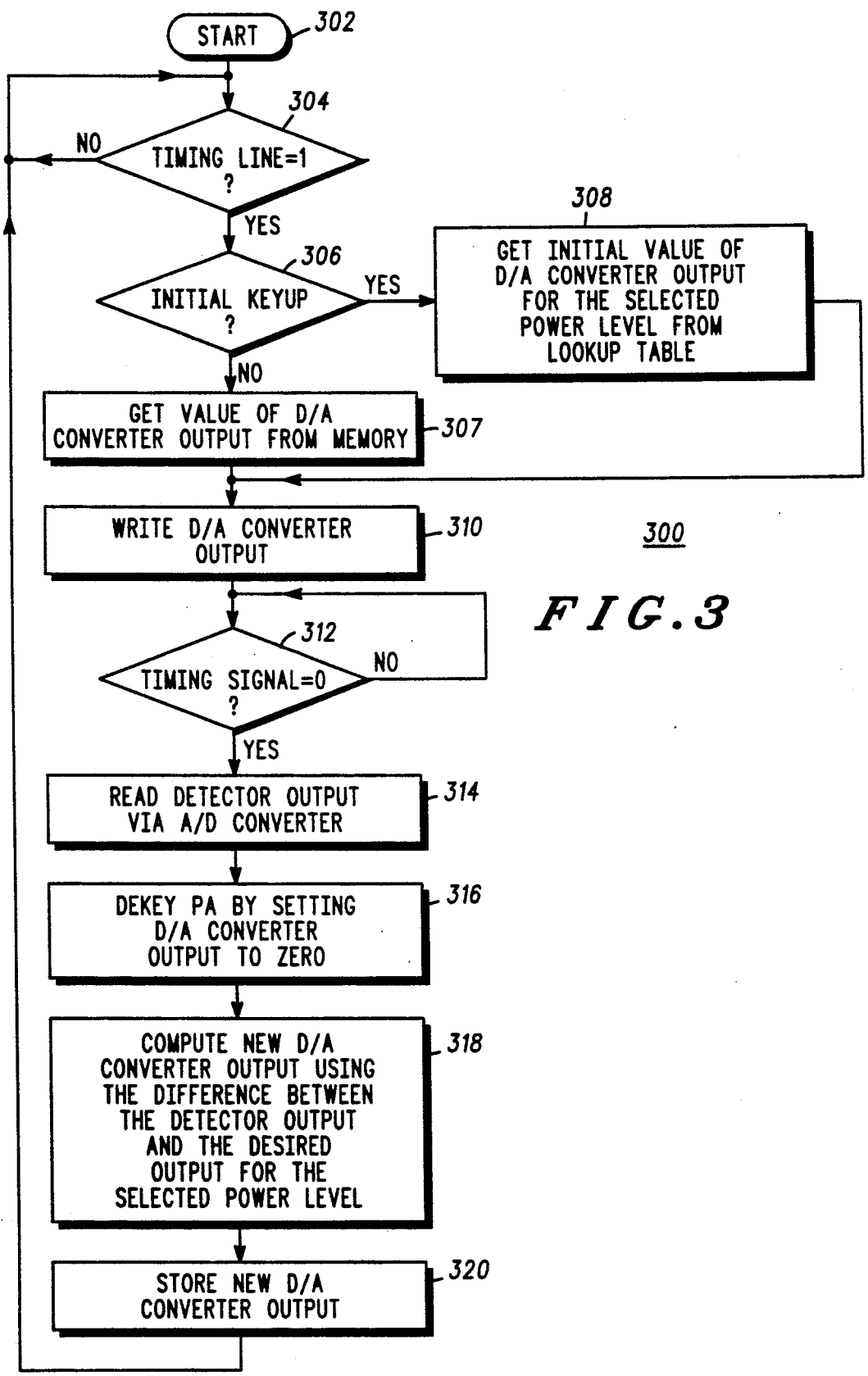
FIG. 3 is a flow chart for the process used by controller 120 in FIG. 1.

Referring next to FIG. 3, there is illustrated a flow chart for the process used by controller 120 for maintaining the output power of the transmit output signal 114 at the desired power level. Entering at START block 302, the process proceeds to decision block 304, where a check of timing signal 124 is made to determine if timing signal 124 has a binary one state. If not, NO branch is taken to wait. If timing signal 124 has a binary one state, YES branch is taken from decision block 304 to block 306, where a check of is made to determine if transmitter 604 is initially being keyed up (i.e. turned on). If so, YES branch is taken to block 308 where an initial value for D/A converter output 128 is retrieved for a lockup table in the memory of controller 120. If transmitter 604 is not being initially keyed up, NO branch is taken from decision block 306 to block 307 where the previously stored value (i.e. stored during previous assigned time slot) for D/A converter output 128 is retrieved from the memory of controller 120. Next, at block 310, the retrieved value to for D/A converter output 128 is applied to D/A converter 126. D/A converter 126 in turn converts the applied value to an analog voltage, which is applied to variable gain stage 104 for adjusting the amount of gain.

Next, at decision block 312 in FIG. 3, a check of timing signal 124 is made again to determine if the timing signal 124 has a binary zero state. If not, NO branch is taken to wait. If timing signal 124 has a binary zero state, YES branch is taken from decision block 312 to block 314, where the value of detector output 130 is read from A/D converter 118. Next, at block 316, transmitter 604 is dekeyed (i.e., shut off) by setting D/A converter output 128 to zero. Then, at block 318, a new value of D/A converter output 128 is calculated by subtracting the sampled value of the detector output 130 from the desired value for the selected power level, scaling the difference by a preselected factor, and summing the scaled difference with the previous value of D/A converter output 128 stored in memory. Then, the new value of D/A converter output 128 is stored in the memory of controller 120 at block 320 for use during the next assigned time slot, and control returns to decision block 304 to repeat the foregoing process for the next assigned time slot.

Referring next to FIG. 4, there is illustrated an alternative embodiment of power control circuitry for TDMA RF transmitters, embodying the present invention. In this embodiment, rather than a long time constant detector 116 as in FIG. 1, output power is continuously detected and corrected by means of detector 426, which extracts the modulation envelope of the modulated transmit IF signal prior to level adjustment. The output of detector 426 is then multiplied by multiplier D/A converter (DAC) 428 in order to produce a scaled modulation envelope signal, the scaling factor being chosen to produce the desired power level of transmit output signal 114 (i.e., each power level has a predetermined scaling factor). The scaled modulation envelope signal from DAC 428 is applied to the positive input of error amplifier 424, which produces a gain control signal for adjusting the gain of variable gain stage 104. Detector 422 (which may be a diode detector) receives a portion of transmit output signal 114 via coupler 112, and produces a detector output signal representing the transmit envelope of the transmit output signal 114. This envelope signal, without time delay, forms the negative input to error amplifier 424. Variable gain stage 104, mixer 106, bandpass filter 130 and amplifier 110 then operate to reduce the error between transmit envelope from detector 422 and modulation envelope from DAC 428 to zero, and thus maintain output power of transmit output signal 114 at a desired power level selected by the scaling factor applied to multiplier DAC 428 by microcomputer 614. The scaling factor applied by microcomputer 614 to DAC 428 is selected by the level control signals, in the substantially the same manner which power level signals 122 are applied to the digital controller 120 of FIG. 1. In FIG. 4, mixers 404 and 408, phase shifter 406, and combiner 410 form a quadrature modulator, such as is discussed in the aforementioned copending patent application Ser. No. 07/526,156.

Referring next to FIG. 5, there is illustrated another alternative embodiment of power control circuitry for TDMA RF transmitters, embodying the present invention. In the embodiment of FIG. 5, the method of FIG. 4 is implemented in an alternate manner by means of diode detector 524 and A/D converter 118, the output of which is connected to a digital controller 502. Digital controller 502, D/A converters 504 and 512, mixers 404 and 408, phase shifter 406, and combiner 410 together form a quadrature modulator, such as is discussed in the aforementioned copending patent application Ser. No. 07/526,156. A comparing function is incorporated in digital controller 502, in the manner of error amplifier 424 of FIG. 4, where one input is the output of A/D converter 118 and the other input, G, is a scaled magnitude signal derived from the transmit I SIGNAL, transmit Q SIGNAL, and POWER LEVEL signals 122 using the following equation:

$$G = [(I\ SIGNAL)^2 + (Q\ SIGNAL)^2]^{1*}\ POWER\ LEVEL*C$$

Where C is a scaling constant correcting for fixed component gain (i.e., each power level has a predetermined power level constant POWER LEVEL and a predetermined scaling constant C).

In the embodiment of FIG. 5, periodic adjustment of transmit output signal 114 in response to the comparing function in digital controller 502 is done during each assigned time slot by means of variable gain stage 104, and also by means of gain adjustments applied by digital controller 502 to the I SIGNAL and Q SIGNAL as they are passed to D/A converters 504 and 512 through digital controller 502. This additional gain adjustment within digital controller 502 permits an increase in the total range of output power for transmit output signal 114, the limiting amount of increase being the usable range of D/A converters 504 and 512.

In the embodiment of FIG. 5, the times at which periodic adjustments are made to transmit output signal 114 during each assigned time slot may be selected to minimize required dynamic range of detector 524. According to EIA IS-54, the modulation is specified as $\pi/4$-shift DQPSK with alpha equal to 0.35 SQRC baseband filtering. $\pi/4$-shift DQPSK modulation modulates the envelope of the RF carrier signal. Envelope modulation of the RF carrier signal increases the dynamic range over which detector 524 must operate. In the case of $\pi/4$-shift DQPSK with alpha equal to 0.35 SQRC baseband filtering, the peak-to-average envelope power is 3 dB, and the average-to-minimum envelope power is 14 dB. As a result, an additional 17 dB is added to the 28 dB dynamic range of detector 524 in order to cover the eight 4 dB power steps. To minimize the dynamic range over which detector 524 must operate, transmit output signal 114 is preferably sampled at the maximum effect points of the $\pi/4$-shift DQPSK modulation. Sampling at these times reduces the additional dynamic range to 4 dB instead of 17 dB. The point in each time slot at which the maximum effect points occur is well known, and is determined by the location of the input impulses in the alpha equal to 0.35 SQRC finite impulse response baseband filters. The maximum effect points are also described in EIA IS-54.

In summary, unique output power control circuitry maintains the output power of transmit output signal at a desired power level selected by power level signals during a series of transmit intervals, such as, for example, the assigned time slots of a TDMA RF channel. In operation, a variable gain stage is used to adjust a modulated IF signal, which is then mixed with an RF reference signal to produce the transmit RF signal. The transmit RF signal is amplified by an RF amplifier to produce the transmit RF output signal which is coupled by a directional coupler and transmit filter to an antenna for transmission. The novel output power control circuitry of the present invention may be advantageously utilized in TDMA cellular telephones as well as in conventional frequency division multiple access cellular telephones, in code division multiple access cellular telephones, and in other analog and digital cellular telephones employing different transmission schemes.

We claim:

1. A transmitter including power control circuitry responsive to level control signals and a transmit intermediate frequency (IF) signal from a signal source for maintaining the magnitude of a radio frequency (RF) output signal at a power level selected from a plurality of power levels by the level control signals, said transmitter comprising:

reference means for generating an RF reference signal;

adjusting means having variable gain for adjusting the transmit IF signal substantially in proportion to the value of a gain control signal to produce an adjusted transmit IF signal;

mixing means for combining the adjusted transmit IF signal and the RF reference signal to produce an RF transmit signal;

amplifying means for amplifying the RF transmit signal to produce the RF output signal;

detecting means coupled to the RF output signal for generating a detector output signal having a value related to the magnitude of the RF output signal; and control means coupled to the detector output signal for, at a plurality of intervals, sampling the value of the detector output signal, and adjusting the value of the gain control signal in response to the difference between the sampled value of the detector output signal and a desired value of the selected power level.

2. A transmitter including power control circuitry according to claim 1, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

3. A transmitter including power control circuitry according to claim 1, further including antenna means and directional coupling means, said directional coupling means coupling a first portion of the RF output signal to the antenna means and coupling a second portion of the RF output signal to the detecting means.

4. A transmitter including power control circuitry according to claim 1, wherein said detecting means comprises diode detecting means.

5. A transmitter including power control circuitry according to claim 1, further including filtering means intercoupling said mixing means and said amplifying means.

6. A transmitter including power control circuitry responsive to a timing signal defining a series of transmit intervals, level control signals, and a transmit intermediate frequency (IF) signal from a signal source for maintaining during the transmit intervals the average magnitude of a radio frequency (RF) output signal at a power level selected from a plurality of power levels by the level control signals, said transmitter comprising:
reference means for generating an RF reference signal;
memory means for storing the value of a gain control signal;
adjusting means having variable gain for adjusting the transmit IF signal during the transmit time intervals substantially in proportion to the stored value of the gain control signal to produce an adjusted transmit IF signal, said adjusting means substantially blocking the transmit IF signal at times other than those during the transmit intervals;
mixing means for combining the adjusted transmit IF signal and the RF reference signal to produce an RF transmit signal;
amplifying means for amplifying the RF transmit signal to produce the RF output signal;
detecting means coupled to the RF output signal for generating a detector output signal having a value related to the average magnitude of the RF output signal; and
control means coupled to the detector output signal for, substantially at the end of each transmit interval, sampling the value of the detector output signal, adjusting the value of the gain control signal in response to the difference between the sampled value of the detector output signal and a desired value of the selected power level, and storing the adjusted value of the gain control signal in the memory means.

7. A transmitter including power control circuitry according to claim 6, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

8. A transmitter including power control circuitry according to claim 6, further including antenna means and directional coupling means, said directional coupling means coupling a first portion of the RF output signal to the antenna means and coupling a second portion of the RF output signal to the detecting means.

9. A transmitter including power control circuitry according to claim 6, wherein said detecting means comprises diode detecting means and averaging means coupled in series.

10. A transmitter including power control circuitry according to claim 6, further including filtering means intercoupling said mixing means and said amplifying means.

11. A time-division multiple-access (TDMA) cellular telephone, comprising:
an antenna;
a TDMA transmitter coupled to the antenna for generating a transmit intermediate frequency (IF) signal and transmitting a TDMA radio frequency (RF) output signal;
a TDMA receiver coupled to the antenna for receiving a TDMA RF input signal;
processing means coupled to the TDMA transmitter and TDMA receiver for producing a timing signal defining a series of transmit intervals for transmitting the TDMA RF output signal and generating a plurality of level control signals for selecting a power level from a plurality of power levels; and
said TDMA transmitter further including power control circuitry coupled to the timing signal and the level control signals for maintaining the magnitude of the TDMA RF output signal at the selected power level, said power control circuitry further including:
reference means for generating an RF reference signal;
memory means for storing the value of a gain control signal;
adjusting means having variable gain for adjusting the transmit IF signal during the transmit time intervals substantially in proportion to the stored value of the gain control signal to produce an adjusted transmit IF signal, said adjusting means substantially blocking the transmit IF signal at times other than those during the transmit intervals;
mixing means for combining the adjusted transmit IF signal and the RF reference signal to produce a TDMA RF transmit signal;
amplifying means for amplifying the TDMA RF transmit signal to produce the TDMA RF output signal;
detecting means coupled to the TDMA RF output signal for generating a detector output signal having a value related to the average magnitude of the TDMA RF output signal; and
control means coupled to the detector output signal for, substantially at the end of each transmit interval, sampling the value of the detector output signal, adjusting the value of the gain control signal in response to the difference between the sampled value of the detector output signal and a desired value of the selected power level, and storing the adjusted value of the gain control signal in the memory means.

12. The TDMA cellular telephone according to claim 11, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

13. The TDMA cellular telephone according to claim 11, further including antenna means and directional coupling means, said directional coupling means coupling a first portion of the RF output signal to the antenna means and coupling a second portion of the RF output signal to the detecting means.

14. The TDMA cellular telephone according to claim 11, wherein said detecting means comprises diode detecting means and averaging means coupled in series.

15. The TDMA cellular telephone according to claim 11, further including filtering means intercoupling said mixing means and said amplifying means.

16. A transmitter including power control circuitry responsive to a timing signal defining a series of transmit intervals, level control signals, and a transmit intermediate frequency (IF) signal from a signal source for maintaining the average magnitude of a radio frequency (RF) output signal at a power level selected from a plurality of power levels by the level control signals during the transmit intervals, said power control circuitry comprising:
    reference means for generating an RF reference signal;
    quadrature modulating means for modulating the transmit IF signal with I and Q signals from a signal source to produce a modulated transmit IF signal;
    adjusting means having variable gain for adjusting the modulated transmit IF signal during the transmit time intervals substantially in proportion to the stored value of a gain control signal to produce an adjusted transmit IF signal, said adjusting means substantially blocking the modulated transmit IF signal at times other than those during the transmit intervals;
    mixing means for combining the adjusted transmit IF signal and the RF reference signal to produce an RF transmit signal;
    amplifying means for amplifying the RF transmit signal to produce the RF output signal;
    detecting means coupled to the RF output signal for generating a detector output signal having a value related to the magnitude of the RF output signal; and
    control means coupled to the detector output signal for sampling the value of the detector output signal a plurality of times during each transmit interval, computing a desired value of the selected power level from the I and Q signals and predetermined constants, adjusting the value of the gain control signal in response to the difference between the sampled value of the detector output signal and the desired value of the selected power level, and applying the adjusted value of the gain control signal to the adjusting means.

17. A transmitter including power control circuitry according to claim 16, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

18. A transmitter including power control circuitry according to claim 16, further including antenna means and directional coupling means, said directional coupling means coupling a first portion of the RF output signal to the antenna means and coupling a second portion of the RF output signal to the detecting means.

19. A transmitter including power control circuitry according to claim 16, wherein said detecting means comprises diode detecting means.

20. A transmitter including power control circuitry according to claim 16, further including filtering means intercoupling said mixing means and said amplifying means.

21. A time-division multiple-access (TDMA) cellular telephone, comprising:
    an antenna;
    a TDMA transmitter coupled to the antenna for generating a transmit intermediate frequency (IF) signal and transmitting a TDMA radio frequency (RF) output signal;
    a TDMA receiver coupled to the antenna for receiving a TDMA RF input signal;
    processing means coupled to the TDMA transmitter and TDMA receiver for producing a timing signal defining a series of transmit intervals for transmitting the TDMA RF output signal and generating a plurality of level control signals for selecting a power level from a plurality of power levels; and
    said TDMA transmitter further including power control circuitry coupled to the timing signal and the level control signals for maintaining the magnitude of the TDMA RF output signal at the selected power level, said power control circuitry further including:
    reference means for generating an RF reference signal;
    quadrature modulating means for modulating the transmit IF signal with I and Q signals from a signal source to produce a modulated transmit IF signal;
    adjusting means having variable gain for adjusting the modulated transmit IF signal during the transmit time intervals substantially in proportion to the stored value of a gain control signal to produce an adjusted transmit IF signal, said adjusting means substantially blocking the modulated transmit IF signal at times other than those during the transmit intervals;
    mixing means for combining the adjusted transmit IF signal and the RF reference signal to produce an RF transmit signal;
    amplifying means for amplifying the RF transmit signal to produce the RF output signal;
    detecting means coupled to the RF output signal for generating a detector output signal having a value related to the magnitude of the RF output signal; and
    control means coupled to the detector output signal for sampling the value of the detector output signal a plurality of times during each transmit interval, computing a desired value of the selected power level from the I and Q signals and predetermined constants, adjusting the value of the gain control signal in response to the difference between the sampled value of the detector output signal and the desired value of the selected power level, and applying the adjusted value of the gain control signal to the adjusting means.

22. The TDMA cellular telephone according to claim 21, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

23. The TDMA cellular telephone according to claim 21, further including antenna means and directional coupling means, said directional coupling means coupling a first portion of the RF output signal to the antenna means and coupling a second portion of the RF output signal to the detecting means.

24. The TDMA cellular telephone according to claim 21, wherein said detecting means comprises diode detecting means.

25. The TDMA cellular telephone according to claim 21, further including filtering means intercoupling said mixing means and said amplifying means.

26. A transmitter including power control circuitry responsive to level control signals and a transmit intermediate frequency (IF) signal from a signal source for maintaining the magnitude of a radio frequency (RF) output signal at a power level selected from a plurality of power levels by the level control signals, said power control circuitry comprising:
    first detecting means coupled to the transmit IF signal for generating a first detector output signal having a value related to the magnitude of the transmit IF signal;
    reference means for generating an RF reference signal;
    adjusting means having variable gain for adjusting the transmit IF signal substantially in proportion to the value of a gain control signal to produce an adjusted transmit IF signal;
    mixing means for combining the adjusted transmit IF signal and the RF reference signal to produce an RF transmit signal;
    amplifying means for amplifying the RF transmit signal to produce the RF output signal;
    second detecting means coupled to the RF output signal for generating a second detector output signal having a value related to the magnitude of the RF output signal;
    control means coupled to the first detector output signal for, at a plurality of intervals, sampling the value of the first detector output signal, and computing a desired value of the selected power level from the sampled value of the first detector output signal and predetermined constants; and
    comparing means for adjusting the value of the gain control signal in response to the difference between the value of the second detector output signal and the desired value of the selected power level.

27. A transmitter including power control circuitry according to claim 26, wherein said control means includes analog to digital converting means coupled to the detecting means, digital to analog converting means coupled to the adjusting means, and processing means coupled to said analog to digital converting means and said digital to analog converting means, said analog to digital converting means for converting the detector output to a digitized signal, said processing means sampling the digitized signal to sample the value of the detector output signal and generating a digitized gain control signal, and said digital to analog converting means converting the digitized gain control signal to the gain control signal.

28. A transmitter including power control circuitry according to claim 26, further including antenna means and directional coupling means, said directional coupling means coupling a first portion of the RF output signal to the antenna means and coupling a second portion of the RF output signal to the detecting means.

29. A transmitter including power control circuitry according to claim 26, wherein said first and second detecting means comprise first and second diode detecting means, respectively.

30. A transmitter including power control circuitry according to claim 26, further including filtering means intercoupling said mixing means and said amplifying means.

* * * * *